(12) United States Patent
Teng et al.

(10) Patent No.: US 7,598,104 B2
(45) Date of Patent: Oct. 6, 2009

(54) METHOD OF FORMING A METAL CONTACT AND PASSIVATION OF A SEMICONDUCTOR FEATURE

(75) Inventors: Jinghua Teng, Singapore (SG); Ee Leong Lim, Singapore (SG); Soo Jin Chua, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 0 days.

(21) Appl. No.: 11/939,227

(22) Filed: Nov. 13, 2007

(65) Prior Publication Data
US 2008/0121916 A1    May 29, 2008

Related U.S. Application Data

(60) Provisional application No. 60/867,140, filed on Nov. 24, 2006.

(51) Int. Cl.
H01L 21/00 (2006.01)
(52) U.S. Cl. .................. 438/40; 438/739; 313/495; 257/E21.038; 257/E21.235
(58) Field of Classification Search .............. 438/20, 438/38, 39, 40, 713, 717, 738, 739; 313/309, 313/336, 495; 257/E21.038, E21.235
See application file for complete search history.

(56) References Cited

U.S. PATENT DOCUMENTS

| 3,840,986 | A |   | 10/1974 | Schmidtke et al. |
|---|---|---|---|---|
| 4,830,986 | A |   | 5/1989 | Plumb |
| 5,059,552 | A |   | 10/1991 | Harder et al. |
| 5,619,097 | A | * | 4/1997 | Jones ................ 313/495 |
| 5,925,891 | A | * | 7/1999 | Koga et al. ............. 257/10 |
| 6,210,997 | B1 |   | 4/2001 | Adachi et al. |
| 6,846,740 | B2 |   | 1/2005 | Demir et al. |
| 7,008,810 | B2 |   | 3/2006 | Höss et al. |
| 2003/0141507 | A1 |   | 7/2003 | Krames et al. |
| 2004/0147094 | A1 |   | 7/2004 | Haberern et al. |
| 2004/0152224 | A1 |   | 8/2004 | Sheppard et al. |
| 2004/0218648 | A1 |   | 11/2004 | Sung et al. |

(Continued)

OTHER PUBLICATIONS

J. M. Dallesasse, et al., "Native-oxide stripe-geometry $Al_xGa_{1-x}As$-GaAs quantum well heterostructure lasers", Appl. Phys. Lett., vol. 58, No. 4, Jan. 28, 1991, pp. 394-396.

(Continued)

*Primary Examiner*—Quoc D Hoang
(74) *Attorney, Agent, or Firm*—Oblon, Spivak, McClelland, Maier & Neustadt, L.L.P.

(57) ABSTRACT

A method of forming a metal contact and passivation of a semiconductor feature, and devices made using the method. The method comprises the steps of forming a dielectric mask on a semiconductor substrate utilising photolithography processes; etching the semiconductor substrate such that one or more features are formed underneath respective portions of the dielectric mask; depositing a passivation layer on the substrate with the dielectric mask in place above the features; subjecting the substrate to an etchant such that the dielectric mask is etched at a higher rate than the passivation layer, whereby portions of the passivation layer deposited on the dielectric mask are lifted off from the substrate; and depositing a metal layer on the substrate including over the remaining passivation layer and exposed portions of the features.

16 Claims, 6 Drawing Sheets

U.S. PATENT DOCUMENTS

2006/0045155 A1    3/2006   Kim et al.

OTHER PUBLICATIONS

C. Y. Liu, et al., "InGaAs-GaAs 980-nm Stripe-Geometry and Circular Ring Ridge Waveguide Lasers Fabricated with Pulsed Anodic Oxidation", IEEE Photonics Technology Letters, vol. 17, No. 2, Feb. 2005, pp. 273-275.

Dong-ho Kim, et al. "Enhanced light extraction from GaN-based light-emitting diodes with holographically generated two-dimensional photonic crystal patterns", Applied Physics Letters, vol. 87, 2005, pp. 203508-1 to 203508-3.

* cited by examiner (a)

(b)

METHOD OF FORMING A METAL CONTACT AND PASSIVATION OF A SEMICONDUCTOR FEATURE

FIELD OF INVENTION

The present invention relates broadly to a method of forming a metal contact and passivation of a semiconductor feature, and to a semiconductor device.

BACKGROUND

The metal contacts of semiconductor devices to the ridge or mesa structures of the devices are typically formed by creating a via hole through the passivation layer. The position of this via hole is defined by aligning a mask during a photolithography process. Because of the tolerance limit of the lithography process, the width of this via hole normally is significantly smaller than the width of the area of the semiconductor where the metal contact is to be created. This results in small metal contact areas and uneven distribution of the current in the mesa area, which in turn will result in a high device driving voltage. This problem is particularly critical for GaN based devices since the p-type nitride semiconductor material has a relatively low carrier mobility and a low active carrier concentration. Accordingly, p-type nitride semiconductor material normally shows a relatively high resistivity. Hence, it is beneficial for the ohmic contact to p-type nitride material to cover as much surface area as possible.

It is also a challenge to make metal contacts to small feature sized semiconductor devices, e.g. with a mesa or ridge dimension less than 1 μm. Normal photolithography reaches its limitation at this range.

Due to the above mentioned disadvantages of photolithography processes for making metal contacts to semiconductor devices, a number self-aligned technologies have been proposed. In one such self-aligned technology described in U.S. Pat. No. 6,210,997, sidewall oxidation is utilised to form the passivation layer of the semiconductor device. However, the sidewall oxidation method has a number of disadvantages, including that where thermal oxidation is used, high temperatures are required which may adversely effect the semiconductor device and is also believed to be effective only for high aluminium content materials. On the other hand, if anodic oxidation is used, a current is needed to assist the oxidation process, which is not typically acceptable in semiconductor fabrication processes.

In another self-aligned technique described in US patent publication no. 2006/00451555, a metal contact layer is used as mesa or ridge etching mask. Such a method has the disadvantage of etching of metals not being compatible to a number of semiconductor processes, like for InP and GaAs based semiconductor devices.

In another self-aligned technique described in US patent publication no. 2004/0218648, dielectric etch back is utilised to make the self-aligned metal contact, utilising a multi-step dielectric plasma etching process. This method has the disadvantage associated with performing a plasma etching process, which can cause damage to the semiconductor surface during the plasma etching of the dielectric material on top of the contact area.

In another method described in U.S. Pat. No. 6,846,740, polymer reflow is utilised to form the passivation layer of the semiconductor device. This method has the disadvantage that the polymer can limit high temperature semiconductor processes after passivation. For example, metal alloying to form an ohmic contact in GaN based semiconductor devices typically requires a temperature of 500° C.-600° C., where a polymer based passivation layer is unsuitable.

On the other hand, light extraction in semiconductor light emitting devices is one of the important factors in enhancing the device efficiency. Although pillar-structured surface textures or pillar-structured LED arrays were found to enhance device efficiency, it is a challenge to make ohmic contact to a pillared device structure. Sidewall passivation in a semiconductor device is required to prevent current leakage and short circuits and also to protect the device from environmental conditions. However, existing techniques typically spread a metal layer over the entire surface without a passivation layer on the sidewall of the etched pattern.

A need therefore exists to provide a self-aligned metal contact formation technique which seeks to address at least one of the above mentioned problems.

SUMMARY

In accordance with a first aspect of the present invention there is provided a method of forming a metal contact and passivation of a semiconductor feature, the method comprising the steps of forming a dielectric mask on a semiconductor substrate utilising photolithography processes; etching the semiconductor substrate such that one or more features are formed underneath respective portions of the dielectric mask; depositing a passivation layer on the substrate with the dielectric mask in place above the features; subjecting the substrate to an etchant such that the dielectric mask is etched at a higher rate than the passivation layer, whereby portions of the passivation layer deposited on the dielectric mask are lifted off from the substrate; and depositing a metal layer on the substrate including over the remaining passivation layer and exposed portions of the features.

The features may have different widths chosen such that during when the substrate is subjected to the etchant, the portions of the dielectric mask above wider ones of the features remain on the substrate, such that when the metal layer is deposited on the substrate, the wider ones of the features are un-exposed, for providing isolation between the features having the different widths.

The step of etching the semiconductor substrate such that the features are formed underneath the respective portions of dielectric mask may comprise forming an undercut under the respective portions of the dielectric mask whereby a width of the features is smaller than a width of the respective portions of the dielectric mask.

Top surfaces of the features may be free from the passivation layer after the step of subjecting the substrate to the etchant.

Sidewalls and a base of the features except the top surfaces may be covered with the passivation layer after the step of subjecting the substrate to the etchant.

The step of forming the dielectric mask on the semiconductor substrate utilising photolithography processes may comprise depositing a dielectric mask layer on the substrate; depositing a sacrificial dielectric layer on the dielectric mask; and forming a double layered hard mask comprising the respective portions of the dielectric mask and corresponding portions of the sacrificial dielectric layer.

The method may comprise etching the portions of the dielectric mask after the step of etching the semiconductor substrate such that the features are formed, such that undercuts are formed underneath the respective corresponding portions of the sacrificial dielectric layer; and the step of depositing the passivation layer on the substrate is performed such that the passivation layer is discontinuous across the respective undercuts.

The formation of the undercuts may be controlled such that a selected width of top surfaces of the features remain free from the passivation layer after the step of subjecting the substrate to the etchant.

The sacrificial dielectric layer may comprise the same material as the passivation layer.

In accordance with a second aspect of the present invention there is provided a semiconductor device comprising one or more semiconductor features metal contacted and passivated using the method as defined in the first aspect.

The device may comprise a ridge waveguide optical device.

The optical device may comprise a ridge waveguide laser.

The device may comprise an LED structure, the LED structure comprising a plurality of pillars as the semiconductor features, wherein each pillar comprises a semiconductor layer of a first dopant type.

Each pillar may extend into a semiconductor layer of a second dopant type different from the first type, whereby extraction of light trapped in the semiconductor layer of the second type is facilitated through an enhanced photonic crystal effect.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

The described methods provide a technique to form self-aligned metal contact layers and passivation layers onto semiconductor devices, especially semiconductor devices in small features. Devices fabricated using the methods are also described.

Figure 1:
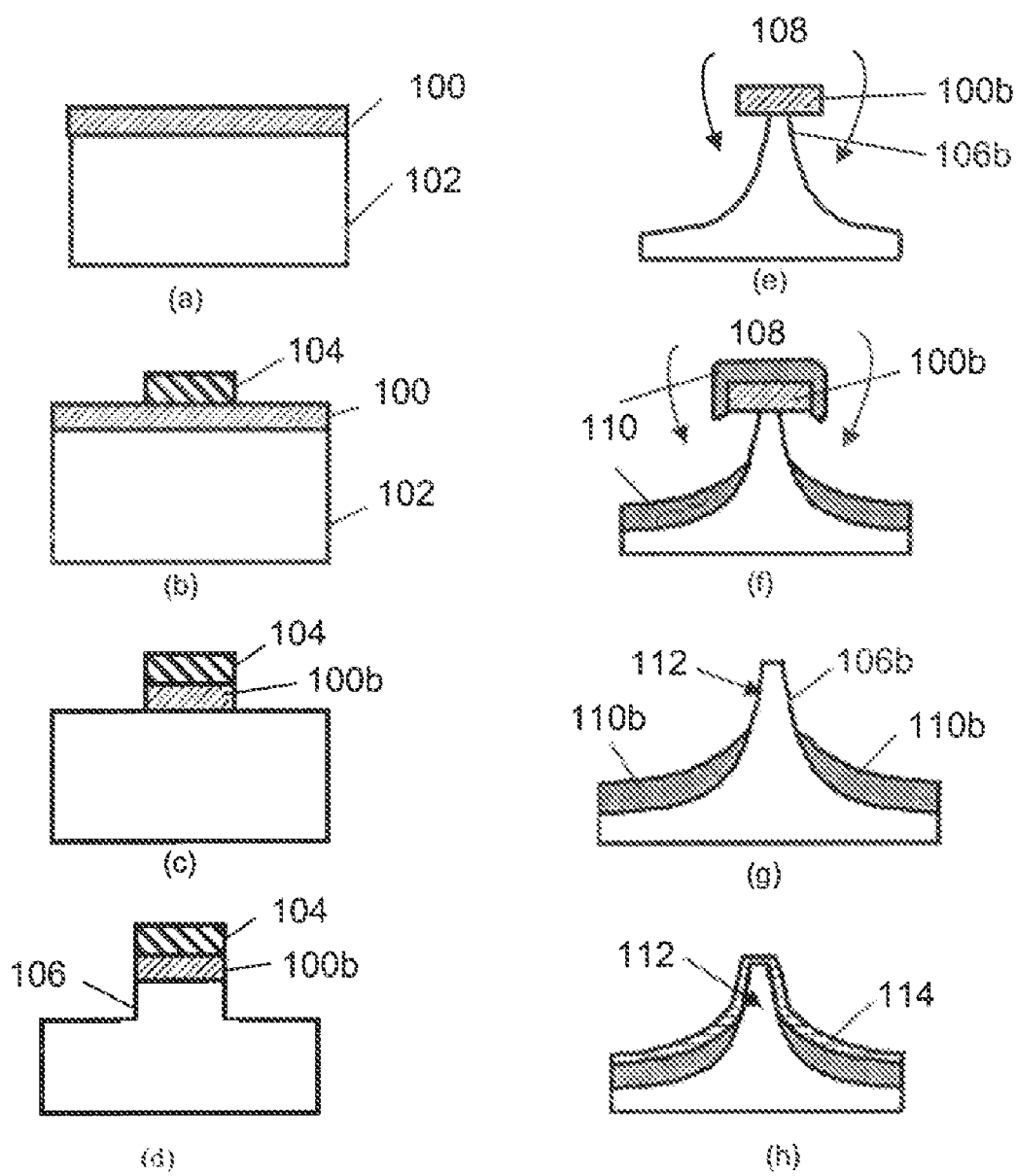
FIGS. 1(a) to (h) show schematic cross-sectional drawings illustrating a method to make self-aligned metal contact to a semiconductor device, including formation of passivation layer formation.

FIGS. 1(a) to (g) show schematic cross-sectional drawings illustrating a method to make self-aligned metal contact to a semiconductor device, e.g. a semiconductor ridge waveguide structure. In FIG. 1(a), a layer of silicon dioxide 100 is deposited on a semiconductor wafer 102. Next, a photoresist 104 is deposited and patterned using a standard photolithography process, as illustrated in FIG. 1(b). Dry etching of the silicon dioxide 100 is then performed to define the silicon dioxide hard mask 100b, as shown in FIG. 1(c). For example, the silicon dioxide 100 can be etched by reactive ion etching (RIE) using $CHF_3$ and Ar plasma.

Next, a dry or wet etching process is performed to etch the semiconductor material 102 to define a ridge portion 106, as shown in FIG. 1(d). For example, inductively coupled plasma (ICP) system using $BCl_3/Cl_2$ gas can be used to dry etch InP. While $HCl:H_3PO_4$ based solution is used for the wet etching of InP. The photoresist 104 is then removed using, for example, Aceton, and the semiconductor 102 etched to create an undercut 108 below the hard mask 100(b), and modified ridge 106b, as shown in FIG. 1(e).

Next, silicon nitride 110 (or titanium oxide) is deposited using e.g. chemical vapour deposition such as plasma enhanced chemical vapour deposition (PECVD), as shown in FIG. 1(f). The geometrical shape of the undercut 108 prevents or greatly reduces the deposition of the silicon nitride 110 under the hard mask 100b.

The silicon nitride 110 on top of the ridge 106b is lifted off in buffered hydrofluoric acid. The hydrofluoric acid will etch both the silicon dioxide 100b and the silicon nitride 110. However, the etch rate of the silicon dioxide 100b is about seven times faster than the etch rate of the silicon nitride 110. The thickness of silicon nitride 110 is designed such that after the silicon dioxide layer 100b is etched away, there is still enough silicon nitride 110b layer left on the other parts of the semiconductor 102, as shown in FIG. 1(g). When the sacrificial silicon dioxide 100b above the semiconductor is etched away and the silicon nitride layer above the silicon dioxide 100b is thus lifted-off from the structure, the semiconductor ridge top area 112 is exposed. Meanwhile, the silicon nitride layer 110b is still on the bottom and sidewalls of the ridge 106b and will act as a passivation layer.

The metal layers 114 to form the metal contact are then deposited, as shown in FIG. 1(h). The metal 114 will only be in electrical contact with the exposed ridge top area 112 and completely cover the ridge top area 112. Metal contact can thus be made to the whole contact area of mesa or ridge structures, which is beneficial for materials having low conductivity, such as p-GaN.

Figure 2:
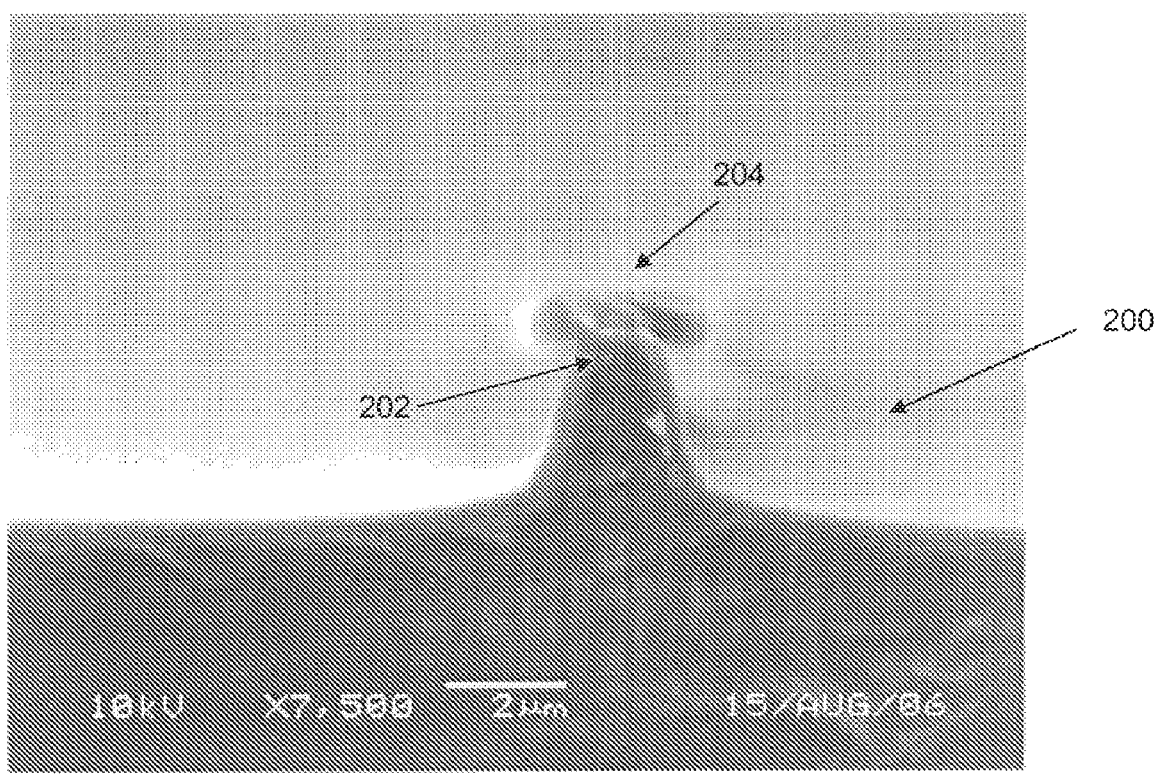
FIG. 2 shows a scanning electron microscopy (SEM) image of a ridge structure fabricated on InP substrate after the process step of FIG. 1(f).

FIG. 2 shows an SEM image of a ridge waveguide structure 200 that has gone through the self-aligned metal contact and passivation layer formation process described above with reference to FIGS. 1(a) to (f). As can be seen from FIG. 2, the final semiconductor ridge structure 200 is about 1.1 µm wide at the top 202, which is reduced from the about 2 µm wide mask pattern as seen from the overhanging $SiO_2$ hard mask 204.

Figure 3:
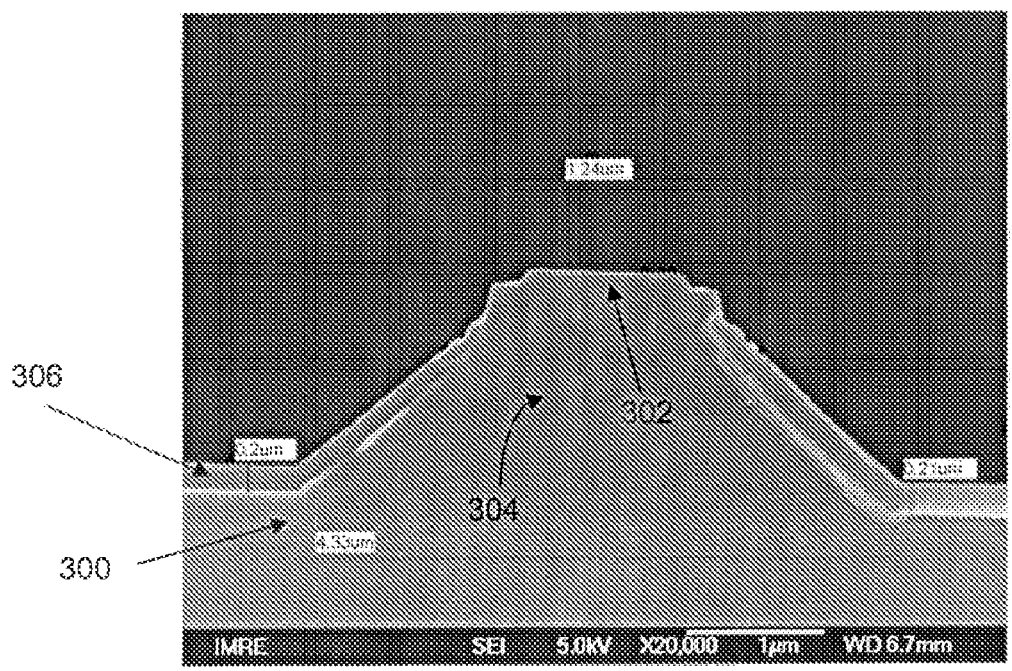
FIG. 3 shows an SEM image of a ridge structure after the process step of FIG. 1(g).
Figure 4:
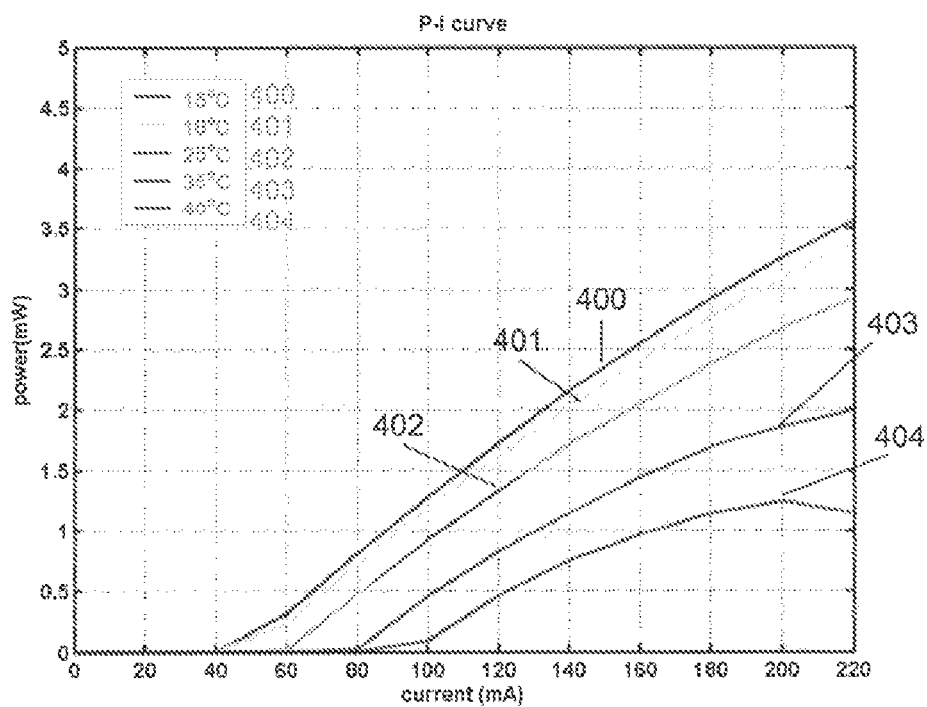
FIG. 4 shows a graph of characteristics of a ridge waveguide laser fabricated using the method of FIGS. 1(a) to (g).

FIG. 3 shows an SEM picture of a ridge waveguide structure 300 after lift-off of the silicon nitride layer to expose the top surface 302 of the ridge 304. The sidewall and other areas of the ridge structure 300 are covered by silicon nitride 306. A ridge waveguide laser with a ridge width of about 1.2 µm has been successfully demonstrated using the method described. The characteristic of light power versus injection current is shown in FIG. 4. The ridge waveguide laser diode was mounted on a heat sink and tested under different heat sink temperatures, as indicated for 400-404 respectively. It is very difficult to make such a small ridge waveguide laser using normal photolithographic technology.

Figure 5:
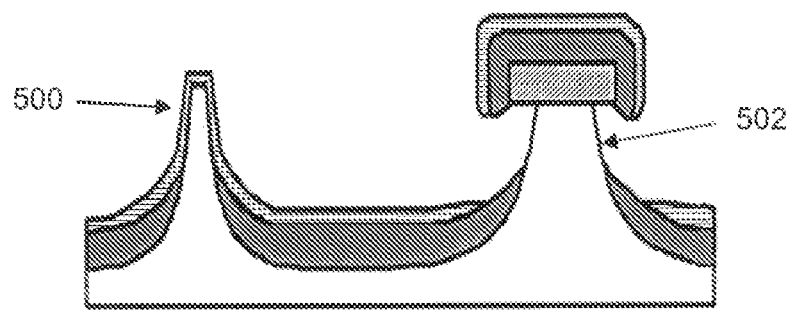
FIGS. 5(a) and (b) show schematic cross-sectional drawings illustrating formation of electrical isolation in the method of FIGS. 1(a) to (g).
Figure 5:
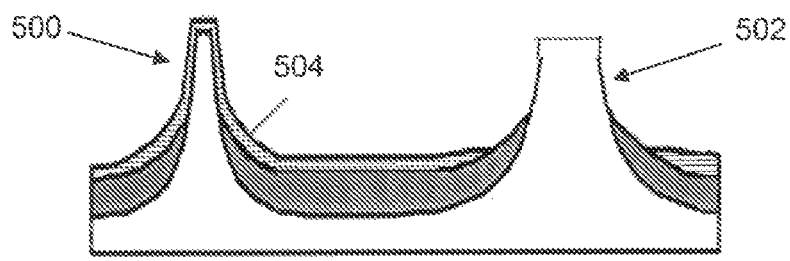

In semiconductor wafer fabrication, the devices fabricated on the same wafer need to be electrically isolated. Instead of taking another photolithography step, the described method can be used to make simultaneous electrical isolation between different devices formed on the same wafer in one step. The time taken for the "lift-off" to occur (compare FIG. 1(f)-(g)) is dependent on the width of the ridge structure. Lift-off from a narrower ridge will be faster than from a wide isolation ridge. This property can be exploited to create the isolation between e.g. individual lasers. FIG. 5(a) illustrates a situation where the lift-off has occurred from a narrower ridge 500 on the left hand side, but not from a wider ridge 502 on the right hand side. After the metal 504 is deposited on the structure, the sample is immersed into a buffered hydrofluoric acid. Thus, the metal contact will remain at the narrower ridge 500 but be lifted off at the wider ridge 502, providing electrical isolation between the individual lasers, as shown in FIG. 5(b).

Figure 6:
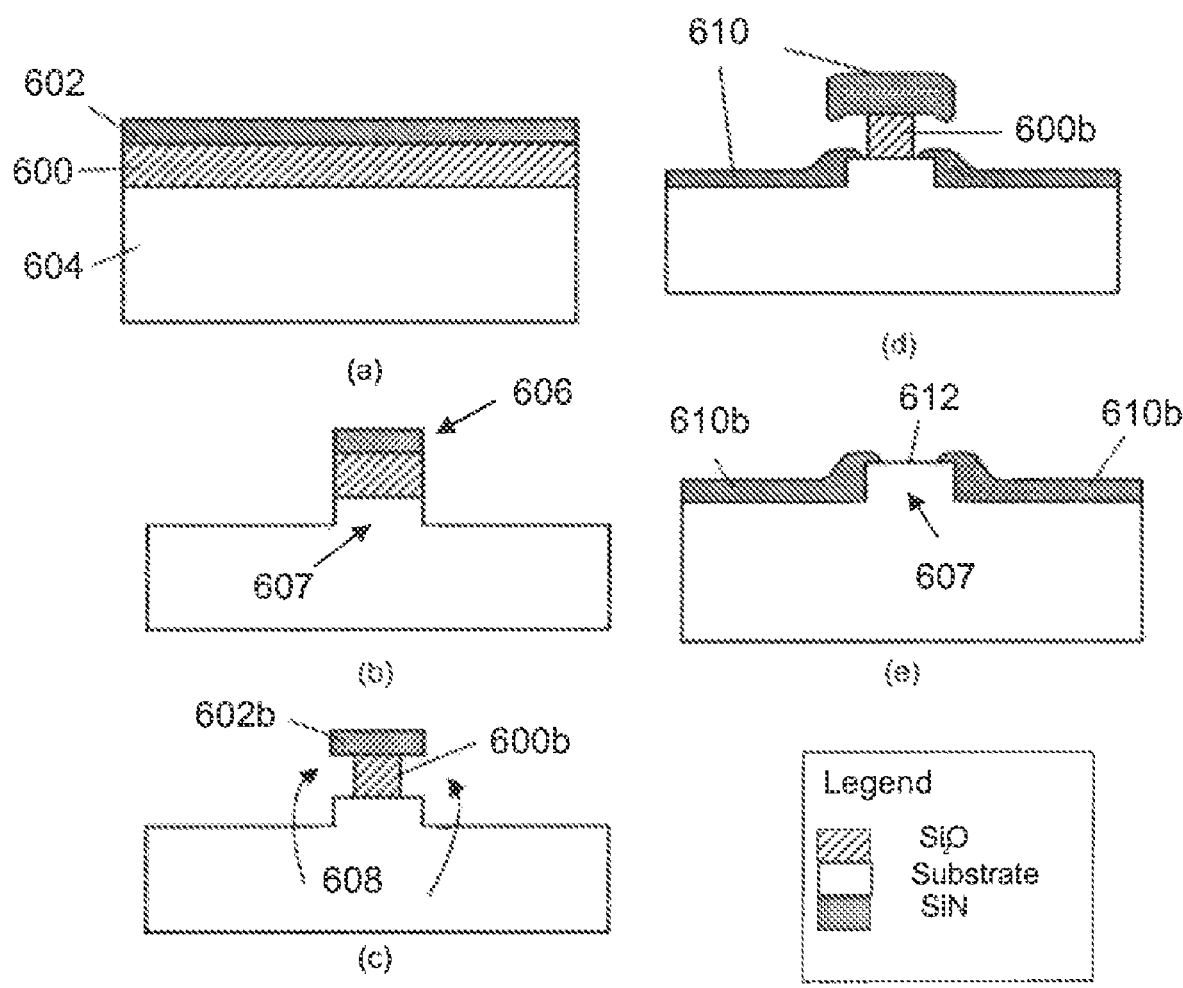
FIGS. 6(a) to (e) show schematic cross-sectional drawings illustrating a method to make self-aligned metal contact to a semiconductor device, including passivation layer formation.

FIGS. 6(a)-(e) show a variation of the method described above with reference to FIGS. 1(a) to (g). A layer of silicon dioxide 600 and a layer of silicon nitride 602 are deposited on a substrate 604, as shown in FIG. 6(a). Next, a hard mask 606 is created using a standard photolitograph process and dry etching, and followed by etching of the substrate 604 to define the device area 607, as shown in FIG. 6(b). The silicon dioxide 600b is wet etched to create an undercut 608 between the semiconductor device area 606 and the silicon nitride 602b, as shown in FIG. 6(c).

A new layer of silicon nitride 610 is then deposited on the wafer 604. Due to the geometrical shape of the undercut 608, the newly deposited silicon nitride layer 610 will not cover the silicon dioxide 600b, which is still exposed for further etching, as shown in FIG. 6(d). The silicon dioxide 600b is removed using BHF and the silicon nitride on top of the silicon dioxide 600b will be lifted-off. The surface 612 of the device area 607 is exposed for metallization and the remaining silicon nitride 610b will act as the passivation layer, as shown in FIG. 6(e).

Figure 7:
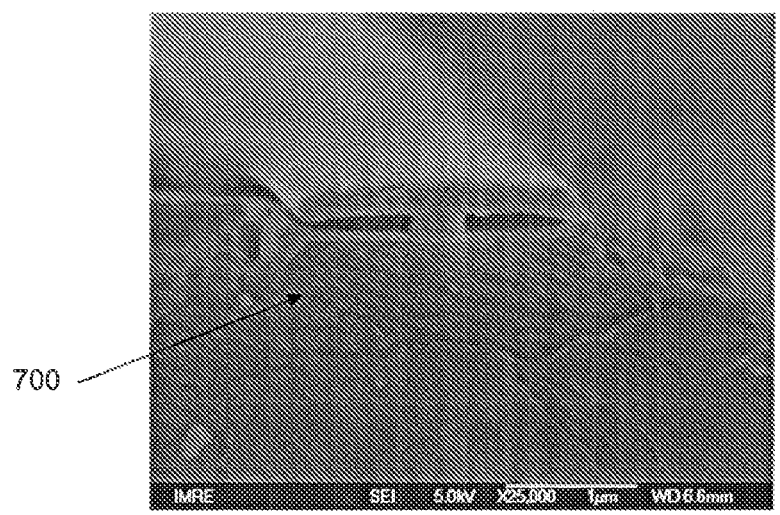
FIG. 7 shows an SEM image of a ridge structure after the process step of FIG. 6(d).

FIG. 7 shows an SEM image of a ridge waveguide structure 700 that has gone through the process steps described above with reference to FIGS. 6(a) to (d).

Similar to the method described above with reference to FIG. 1(b) to (h), electrical isolation can be formed by proper design of the width of the different structures on the wafer and followed by the metal lift off (compare FIGS. 5(a), (b)).

The described methods are applicable to most semiconductor processes and are chosen based on different applications. For example, the method described with reference to FIG. 6(a)-(e) can control the metal contact width. On the top surface of the mesa or ridge structure.

Figure 8:
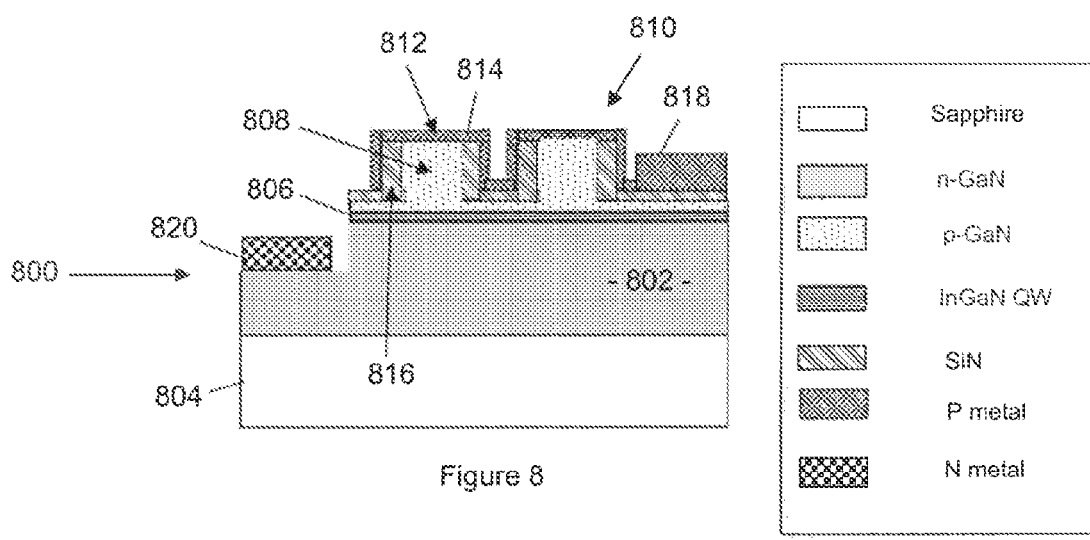
FIG. 8 shows a schematic cross-sectional drawing of a pillared light emitting device (LED) structure.

A light emitting device (LED) structure 800 fabricated using the methods described above is shown in FIG. 8(a). The LED structure 800 has a thick n-GaN layer 802 (1-5 μm) grown on top of a sapphire substrate 804, an InGaN multi-quantum well 806 and a p-GaN layer 808. The LED front surface 810 is patterned and processed into a pillar structure e.g. 812 using either of the methods described above. The top of the pillar e.g. 812 is covered by a thin transparent metal layer 814, while the sidewall and the trench are passivated by dielectric layers 816. The pillar e.g. 812 can be etched to the whole thickness of the p-GaN layer 808. A higher pillar e.g. 812 is more efficient in light extraction. The diameter of the pillar e.g. 812 can be in the range of about 100 nm to 2 μm. A p-contact pad 818 and an n-contact pad 820 are formed for connection to a current source (not shown).

Figure 9:
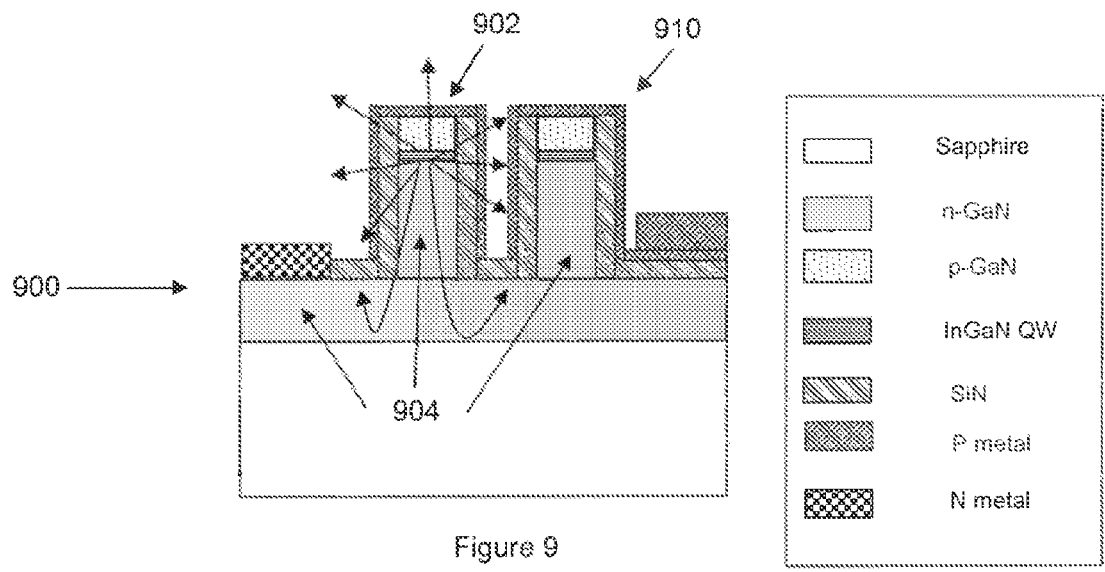
FIG. 9 shows a schematic cross-sectional drawing of another pillared LED structure.

FIG. 9 shows another LED structure 900 with the pillars e.g. 902 etched down to a n-GaN layer 904. Due to the higher refractive index of GaN compared to sapphire, a large amount of light is trapped inside the thick n-GaN layer (compare 802 in FIG. 8). Making the pillar e.g. 902 extend into the n-GaN layer 904 will greatly enhance the light extraction. If the pitch and pattern of the pillars e.g. 902 are arranged according to a photonic bandgap, the deep pillar array 910 is able to provide a photonic crystal effect, which is very weak in shallow etchings, to further enhance the light extraction. The pillar e.g. 902 height can be from about 200 nm to 4 μm. The diameter of the pillar e.g. 902 can be in the range of about 100 nm to 2 μm. The device structure 900 can be fabricated using either one of the self-aligned processes described above. Here the dielectric layer 906 functions as both passivation and electrical isolation.

Existing photonic crystal structures or surface patterning used to enhance the light extraction, are based on hole-structures, for which metal contacts can be readily made. However, a pillar structure like the ones described above with reference to FIGS. 8 and 9 is more efficient in helping light extraction. The self-aligned metal contact and sidewall passivation formation techniques described herein thus provide fabrication of superior LED structures while addressing the problem of making metal contact and sidewall passivation in a pillar based LED structure.

Figure 10:
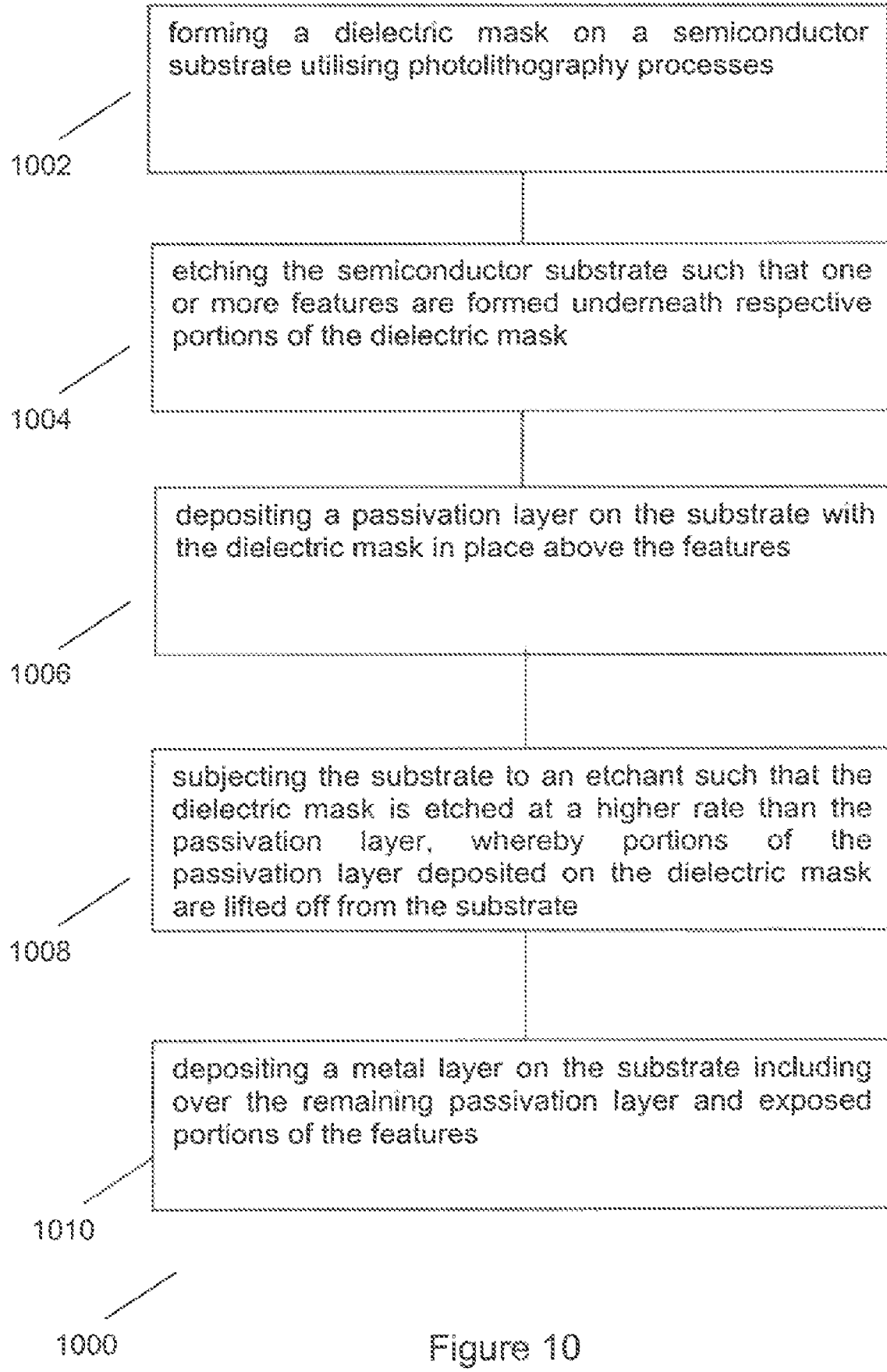
FIG. 10 shows a flowchart illustrating a method of forming a metal contact and passivation of a semiconductor feature in an example embodiment.

FIG. 10 shows a flowchart 1000 illustrating a method of forming a metal contact and passivation of a semiconductor feature in an example embodiment. At step 1002, a dielectric mask is formed on a semiconductor substrate utilising photolithography processes. At step 1004, the semiconductor substrate is etched such that one or more features are formed underneath respective portions of the dielectric mask. At step 1006, a passivation layer is deposited on the substrate with the dielectric mask in place above the features. At step 1008, the substrate is subjected to an etchant such that the dielectric mask is etched at a higher rate than the passivation layer, whereby portions of the passivation layer deposited on the dielectric mask are lifted off from the substrate. At step 1010, a metal layer is deposited on the substrate including over the remaining passivation layer and exposed portions of the features.

A submicron or nano range ridge waveguide can be fabricated using normal photolithography processes from the method of making self-aligned metal contact and passivation as shown in FIG. 1(a)-(h), instead of depending on e-beam or other complicated lithography methods. Electrical isolation can be formed during the process, i.e. without an additional process step. For the above reasons, the productivity and yield of the semiconductor device fabrication process can be greatly enhanced compared with existing processes. Furthermore, the fabrication of submicron nano range ridge structures is very useful for applications where high-density patterns are required, such as very small dimension laser diodes and ultra compact optical waveguides and devices such as optical switches.

The methods described are self-aligning based technology to make metal contacts and passivation layers. There is no requirement to perform mask alignment and open contact windows on top of the mesa or ridge structures. The described methods are thus applicable to very small features, such as those below 1 μm which are near the diffraction limitation of the normal photolithography process. The described methods are particularly useful for the fabrication of nano-electronic or optoelectronic devices that require electrical current injection.

The methods described can make both the metal contact and the dielectric passivation at the same time, saving process steps. Electrical isolation among different devices on the chip can be made at the same time, saving another process step.

The LED devices described can be fabricated using the described self-aligned technology methods and have pillared LED structures with both metal contacts and passivation layers. The LED structures can be fabricated by existing semiconductor process tools. The described pillared LED structures can enhance the light extraction efficiency by breaking the total internal reflection condition. The etched surfaces are protected by the passivation layers, which itself is also beneficial to the light extraction. The described deep etched pillar LED structure can greatly enhance the photonic bandgap effect and release light from the thick n-GaN layer.

The methods described are compatible with the existing semiconductor processes, for both Si and III-V semiconductor. The passivation layer can be a standard dielectric material such as SiN or SiO2 compared to polymer based passivation methods.

The described methods can be applied to the fabrication of semiconductor devices with mesa or ridge structures that need electrical current injection and passivation, especially for those devices with small features, e.g. smaller than 1 μm. Such semiconductor devices include both electronic and photonic devices, such as for example, narrow ridge semiconductor lasers in all different wavelengths, the pillared LED, etc.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of forming a metal contact and passivation of a semiconductor feature, the method comprising the steps of:
   forming a dielectric mask on a semiconductor substrate utilising photolithography processes;
   etching the semiconductor substrate such that one or more features are formed underneath respective portions of the dielectric mask;
   depositing a passivation layer on the substrate with the dielectric mask in place above the features; such that the passivation layer covers at least respective bases of the features;
   subjecting the substrate to an etchant such that the dielectric mask is etched at a higher rate than the passivation layer, whereby portions of the passivation layer deposited on the dielectric mask are lifted off from the substrate; and
   depositing a metal layer on the substrate including over the remaining passivation layer and exposed portions of the features.

2. The method as claimed in claim 1, wherein the features have different widths chosen such that during when the substrate is subjected to the etchant, the portions of the dielectric mask above wider ones of the features remain on the substrate, such that when the metal layer is deposited on the substrate, the wider ones of the features are un-exposed, for providing isolation between the features having the different widths.

3. The method as claimed in claims 1 or 2, wherein the step of etching the semiconductor substrate such that the features are formed underneath the respective portions of dielectric mask comprises forming an undercut under the respective portions of the dielectric mask whereby a width of the features is smaller than a width of the respective portions of the dielectric mask.

4. The method as claimed in claim 3, wherein top surfaces of the features are free from the passivation layer after the step of subjecting the substrate to the etchant.

5. The method as claimed in claim 4, wherein sidewalls and a base of the features except the top surfaces remain covered with the passivation layer after the step of subjecting the substrate to the etchant.

6. The method as claimed in claims 1 or 2, wherein the step of forming the dielectric mask on the semiconductor substrate utilising photolithography processes comprises:
   depositing a dielectric mask layer on the substrate;
   depositing a sacrificial dielectric layer on the dielectric mask; and
   forming a double layered hard mask comprising the respective portions of the dielectric mask and corresponding portions of the sacrificial dielectric layer.

7. The method as claimed in claim 6, comprising etching the portions of the dielectric mask after the step of etching the semiconductor substrate such that the features are formed, such that undercuts are formed underneath the respective corresponding portions of the sacrificial dielectric layer; and the step of depositing the passivation layer on the substrate is performed such that the passivation layer is discontinuous across the respective undercuts.

8. The method as claimed in claim 7, wherein the formation of the undercuts is controlled such that a selected width of top surfaces of the features remain free from the passivation layer after the step of subjecting the substrate to the etchant.

9. The method as claimed in claim 8, wherein the sacrificial dielectric layer comprises the same material as the passivation layer.

10. The method as claimed in claim 7, wherein the sacrificial dielectric layer comprises the same material as the passivation layer.

11. The method as claimed in claim 6, wherein the sacrificial dielectric layer comprises the same material as the passivation layer.

12. A semiconductor device comprising one or more semiconductor features metal contacted and passivated using the method as claimed in any one of the preceding claims.

13. The device as claimed in claim 12, wherein the device comprises a ridge waveguide optical device.

14. The device as claimed in claim 13, wherein the optical device comprises a ridge waveguide laser.

15. The device as claimed in claim 12, wherein the device comprises an LED structure, the LED structure comprising a plurality of pillars as the semiconductor features, wherein each pillar comprises a semiconductor layer of a first dopant type.

16. The device as claimed in claim 15, wherein each pillar extends into a semiconductor layer of a second dopant type different from the first type, whereby extraction of light trapped in the semiconductor layer of the second type is facilitated through an enhanced photonic crystal effect.

* * * * *